United States Patent
Tay et al.

(10) Patent No.: US 7,326,859 B2
(45) Date of Patent: Feb. 5, 2008

(54) PRINTED CIRCUIT BOARDS HAVING PADS FOR SOLDER BALLS AND METHODS FOR THE IMPLEMENTATION THEREOF

(75) Inventors: Cheng Siew Tay, Penang (MY); Wendy Chet Ming Ngoh, Melaka (MY); Choi Keng Chan, Penang (MY)

(73) Assignee: Intel Corporation, Santa Clara, CA (US)

( * ) Notice: Subject to any disclaimer, the term of this patent is extended or adjusted under 35 U.S.C. 154(b) by 386 days.

(21) Appl. No.: 10/735,638

(22) Filed: Dec. 16, 2003

(65) Prior Publication Data

US 2005/0128721 A1 Jun. 16, 2005

(51) Int. Cl.
 *H05K 1/16* (2006.01)
(52) U.S. Cl. .................. 174/260; 174/262; 228/180.22
(58) Field of Classification Search ........ 361/772–774, 361/777, 779, 794; 174/250, 260, 261, 262–266; 228/180.22
See application file for complete search history.

(56) References Cited

U.S. PATENT DOCUMENTS

| | | | | |
|---|---|---|---|---|
| 5,175,060 | A * | 12/1992 | Enomoto et al. | 428/620 |
| 5,591,941 | A * | 1/1997 | Acocella et al. | 174/266 |
| 5,815,374 | A * | 9/1998 | Howell | 361/768 |
| 5,875,102 | A * | 2/1999 | Barrow | 361/777 |
| 5,936,848 | A * | 8/1999 | Mehr et al. | 361/777 |
| 6,217,987 | B1 * | 4/2001 | Ono et al. | 428/209 |
| 6,217,988 | B1 * | 4/2001 | Yasue et al. | 428/209 |
| 6,365,843 | B1 * | 4/2002 | Shirai et al. | 174/262 |
| 6,414,248 | B1 * | 7/2002 | Sundstrom | 174/260 |
| 6,448,504 | B1 * | 9/2002 | Taguchi | 174/255 |
| 6,487,088 | B2 * | 11/2002 | Asai et al. | 361/794 |
| 6,607,825 | B1 * | 8/2003 | Wang et al. | 428/343 |
| 6,622,905 | B2 * | 9/2003 | Shier et al. | 228/180.22 |
| 6,724,194 | B1 * | 4/2004 | Barton | 324/432 |
| 6,724,638 | B1 * | 4/2004 | Inagaki et al. | 361/763 |
| 6,831,234 | B1 * | 12/2004 | Asai et al. | 174/261 |
| 6,833,615 | B2 * | 12/2004 | Geng et al. | 257/698 |
| 7,034,402 | B1 * | 4/2006 | Seshan | 257/781 |

* cited by examiner

*Primary Examiner*—Tuan T. Dinh
*Assistant Examiner*—Jeremy C Norris
(74) *Attorney, Agent, or Firm*—Pearl Cohen Zedek Latzer, LLP

(57) ABSTRACT

A printed circuit board includes a group of pads suitable to be soldered to a respective group of solder-balls of a device. Each pad of the group has a crack initiation point on its perimeter at a location where cracks in a solder-ball are anticipated to start after that solder-ball is soldered to that pad. For a pad of that group having a microvia located therein, a center of that microvia is located farther than a center of that pad from its crack initiation point. For a pad of that group having a trace merging along a portion of its perimeter, that portion does not include a vicinity of that crack initiation point.

10 Claims, 11 Drawing Sheets

PRINTED CIRCUIT BOARDS HAVING PADS FOR SOLDER BALLS AND METHODS FOR THE IMPLEMENTATION THEREOF

BACKGROUND OF THE INVENTION

A package suitable to contain one or more semiconductor dies may comprise solder-balls in a ball grid array (BGA). Any or all of the solder-balls may serve as external electrical terminations of the package. A package with one or more semiconductor dies installed therein is known as a device.

Once a device is soldered onto a printed circuit board (PCB), mechanical and/or thermal and/or thermomechanical strains may occur between the package and the PCB. In packages comprising BGA solder-balls, such strains may result in damage to the soldered solder-balls over time.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

Figure 1:
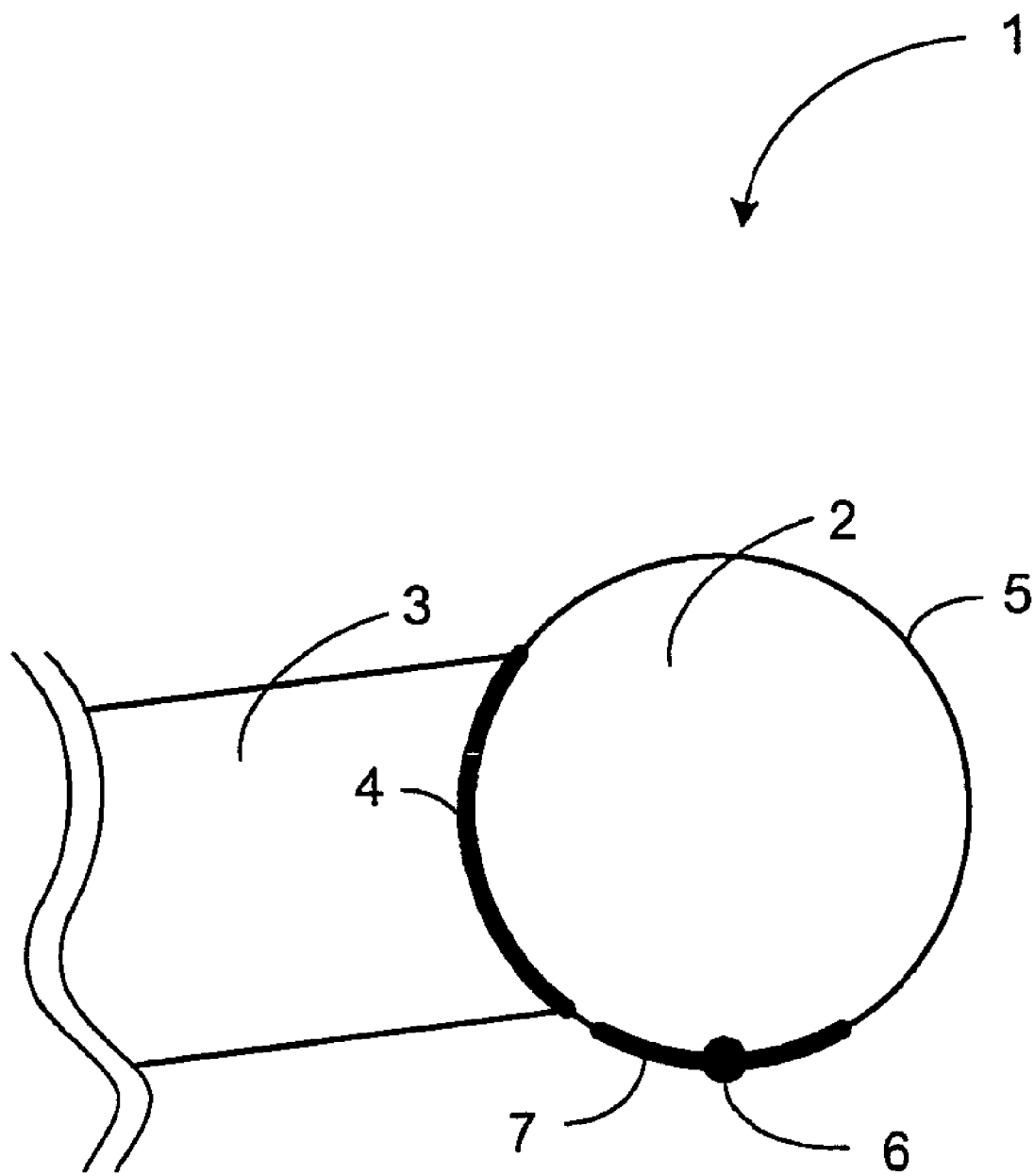
FIGS. 1-3 show a top view of an exemplary printed circuit boards comprising a pad suitable to be soldered to a respective solder-ball of a device and merging with a trace according to some alternative embodiments of the invention.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

A printed circuit board (PCB) may comprise metal pads on its external conductive layer that are soldered to respective solder-balls of a device. Such solder balls may suffer from mechanical fatigue due to, for example, cyclic stress, or thermo-mechanical fatigue due to, for example, coefficient of thermal expansion (CTE) mismatch. As a result of that mechanical fatigue, any or all of these solder balls may develop cracks (fractures), which may gradually degrade the reliability of the electrical coupling these balls provide between the PCB and a semiconductor die contained in the device, and may result in a total failure of the solder joint. Consequently, the reliability of the system in which that PCB is installed may be degraded over time, possibly resulting in a total system failure.

Such cracks may start developing in a solder ball at a point (e.g. "crack initiation point") that is close to the perimeter of the pad, and may propagate through the solder ball in such a way that a projection of the crack onto the pad forms a substantially straight line crossing the center of the pad to a point on the perimeter of the pad that is opposite to the crack initiation point.

Moreover, and although the scope of the invention is not limited in this respect, a projection onto a PCB of the crack propagation directions in solder balls of a device soldered to pads of the PCB may point toward a common point, and the crack initiation point of each solder ball may be near the point of the pad that is the farthest from that common point.

Using currently known and future methods, it may be possible to anticipate the location of the crack initiation point on the perimeter of the pad, and to further anticipate the crack propagation direction.

A solder-ball soldered to a solder-mask defined pad (i.e. a pad that is partially covered with solder mask along its perimeter) may be more prone to crack initiation than a solder-ball soldered to a metal defined pad (i.e. a pad that is not covered with solder mask). For example, this may be due to a protruded solder mask that leads to stress concentration and shape formation on solder-mask defined pads, possibly resulting in "necking". In another example, this may be due to thermo-mechanical tensions between the solder-ball and the solder-mask. Moreover, a solder-ball soldered to a pad that has a trace merging with it (i.e. the pad and the trace are part of the same metal layer of the PCB) along a portion of the pad's perimeter that includes a vicinity of the crack initiation point, may be more prone to crack initiation than a solder-ball soldered to a pad that has a trace merging with it along a portion of the pad's perimeter that does not include a vicinity of the crack initiation point.

A metal pad, suitable to be soldered to a respective solder ball of a device, may have a microvia located therein. A microvia may be a metal-plated through-hole in at least the metal pad and the isolation layer of the PCB underneath the metal pad, providing electrical coupling between the metal pad and one or more internal conductive layers of the PCB and/or another external conductive layer of the PCB.

During the process of soldering a pad having a microvia to a solder-ball of a device, the solder-ball may change its shape. The external shape of the solder-ball may change by, for example, having a part of the solder-ball material filling, at least in part, the through-hole of the microvia. The internal shape of the solder-ball may change, for example, by a formation of a void in the solder-ball material above the microvia. Such a void inside the soldered solder-ball may weaken the solder joint.

The inventors have come to the conclusion that the length of the path between the crack initiation point and the surface of the void may affect the solder fatigue. A longer path may prolong the fatigue life of a solder joint.

Although the size of a void in a solder ball may vary, a void may be substantially centered above the center of the microvia, and consequently, the longer the path between the crack initiation point and the center of the microvia, the longer the path between the crack initiation point and the surface of the void.

According to some embodiments of the invention, instructions may be applied to the implementation of microvias inside pads suitable to be soldered to respective solder-balls of devices, and to the implementation of merging such pads with traces. Instructions according to embodiments of the invention may be used in generating one or more files for manufacturing of a printed circuit board using. Such files may be generated, for example, by a computer aided design (CAD) software in an automatic process or in a human-assisted process. Different priorities may be assigned to different instructions, and it may happen in the implementation of a particular printed circuit board that not all instructions can be implemented for all the pads and all the traces to which the instructions apply.

Figure 2:
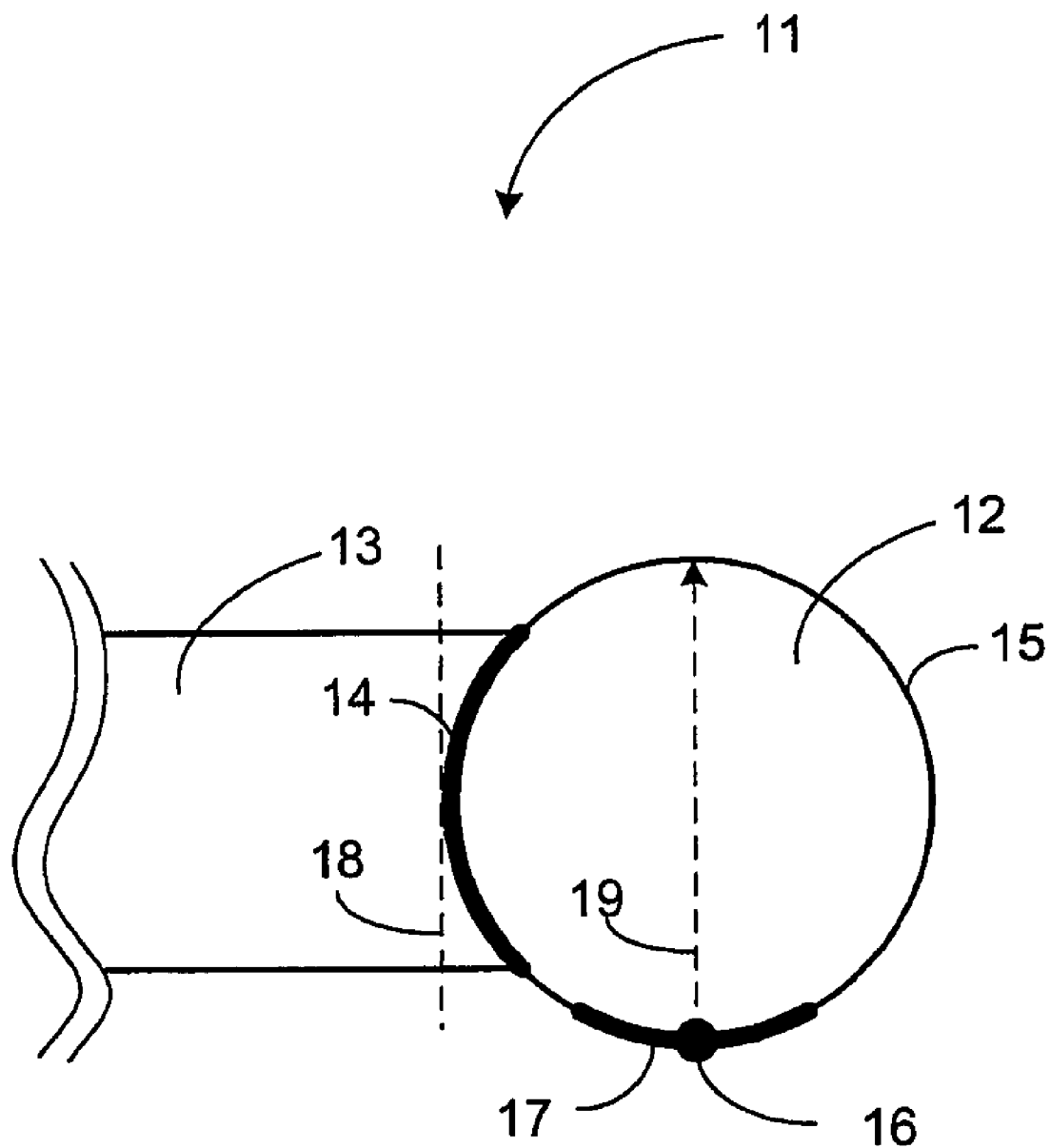
Figure 3:
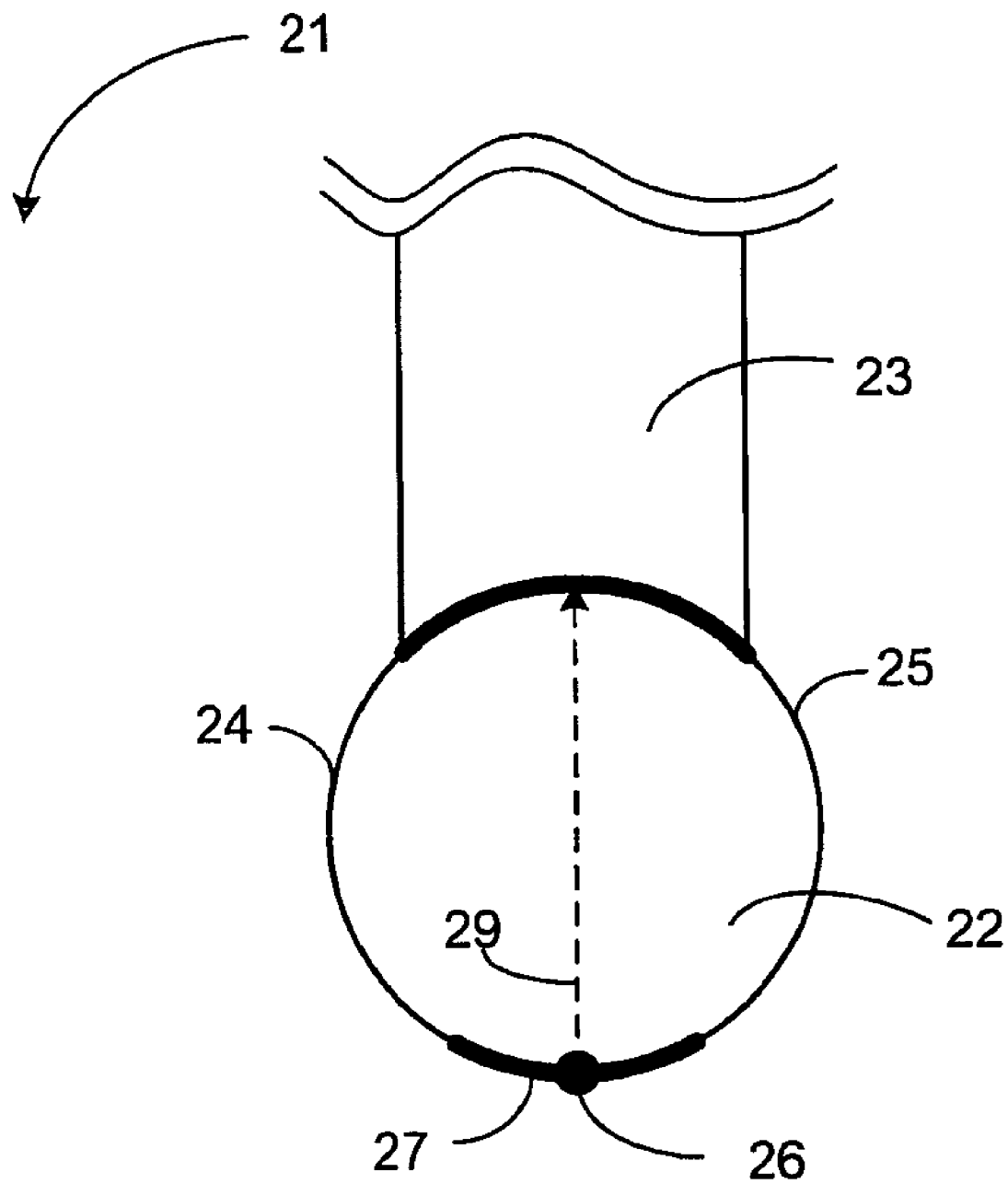

FIGS. 1-3 present three exemplary alternative implementations, using instructions according to some embodiments of the invention, of traces merged with pads that are suitable to be soldered to respective solder-balls of a device.

FIGS. 4-7 present four exemplary alternative implementations, using instructions according to some embodiments of the invention, of microvias in pads that are suitable to be soldered to respective solder-balls of a device FIG. 1 shows an exemplary PCB 1 comprising a pad 2 suitable to be soldered to a solder-ball of a device. Pad 2, which for the clarity of the explanation is substantially round, merges with a trace 3 along a portion 4 of a perimeter 5 of pad 2 according to some embodiments of the invention. A point 6 is the anticipated location of the crack initiation point on the perimeter of pad 2.

A first instruction according to some embodiments of the invention used in the implementation of pad 2 and trace 3 is to merge pad 2 and trace 3 along a portion of perimeter 5 that does not include an arc 7 that is in the vicinity of point 6.

A second instruction according to some embodiments of the invention used in the implementation of pad 2 and trace 3 is to merge pad 2 and trace 3 along a portion of perimeter 5 a length of which is no longer than one quarter of the length of perimeter 5.

FIG. 2 shows an exemplary PCB 11 comprising a pad 12 suitable to be soldered to a respective solder-ball of a device. Pad 12, which for the clarity of the explanation is substantially round, merges with a trace 13 along a portion 14 of a perimeter 15 of pad 12. A point 16 is the anticipated location of the crack initiation point on the perimeter of pad 12. A vector 19 beginning at point 16 is the projection onto pad 12 of the anticipated crack propagation direction. A line 18 is a tangent to perimeter 15 at the middle point of portion 14. Line 18 is substantially parallel to vector 19.

A first instruction, according to some embodiments of the invention, used in the implementation of pad 12 and trace 13 is to merge pad 12 and trace 13 along a portion of perimeter 15 that does not include an arc 17 that is in the vicinity of point 16.

A second instruction, according to some embodiments of the invention, used in the implementation of pad 12 and trace 13 is to merge pad 12 and trace 13 along a portion of perimeter 15 so that a tangent to perimeter 15 at a middle point of the merging portion will be substantially parallel to the projection onto pad 12 of the anticipated crack propagation direction.

A third instruction, according to some embodiments of the invention, used in the implementation of pad 12 and trace 13 is to merge pad 12 and trace 13 along a portion of perimeter 15 a length of which is no longer than one quarter of the length of perimeter 15.

FIG. 3 shows an exemplary PCB 21 comprising a pad 22 suitable to be soldered to a respective solder-ball of a device. Pad 22, which for the clarity of the explanation is substantially round, merged with a trace 23 along a portion 24 of a perimeter 25 of pad 22 according to some embodiments of the invention. A point 26 is the anticipate location of the crack initiation point on the perimeter of pad 22. A vector 29 initiated at point 26 is the projection onto pad 22 of the anticipated crack propagation direction.

A first instruction, according to some embodiments of the invention, used in the implementation of pad 22 and trace 23 is to merge pad 22 and trace 23 along a portion of perimeter 25 that does not include an arc 27 that is in the vicinity of point 26.

A second instruction, according to some embodiments of the invention, used in the implementation of pad 22 and trace 23 is to merge pad 22 and trace 23 along a portion of perimeter 25 so that a straight line joining point 26 and the middle point of the merging portion will be parallel to vector 29.

A third instruction, according to some embodiments of the invention, used in the implementation of pad 22 and trace 23 is to merge pad 22 and trace 23 along a portion of perimeter 25 a length of which is no longer than one quarter of the length of perimeter 25.

Figure 4:
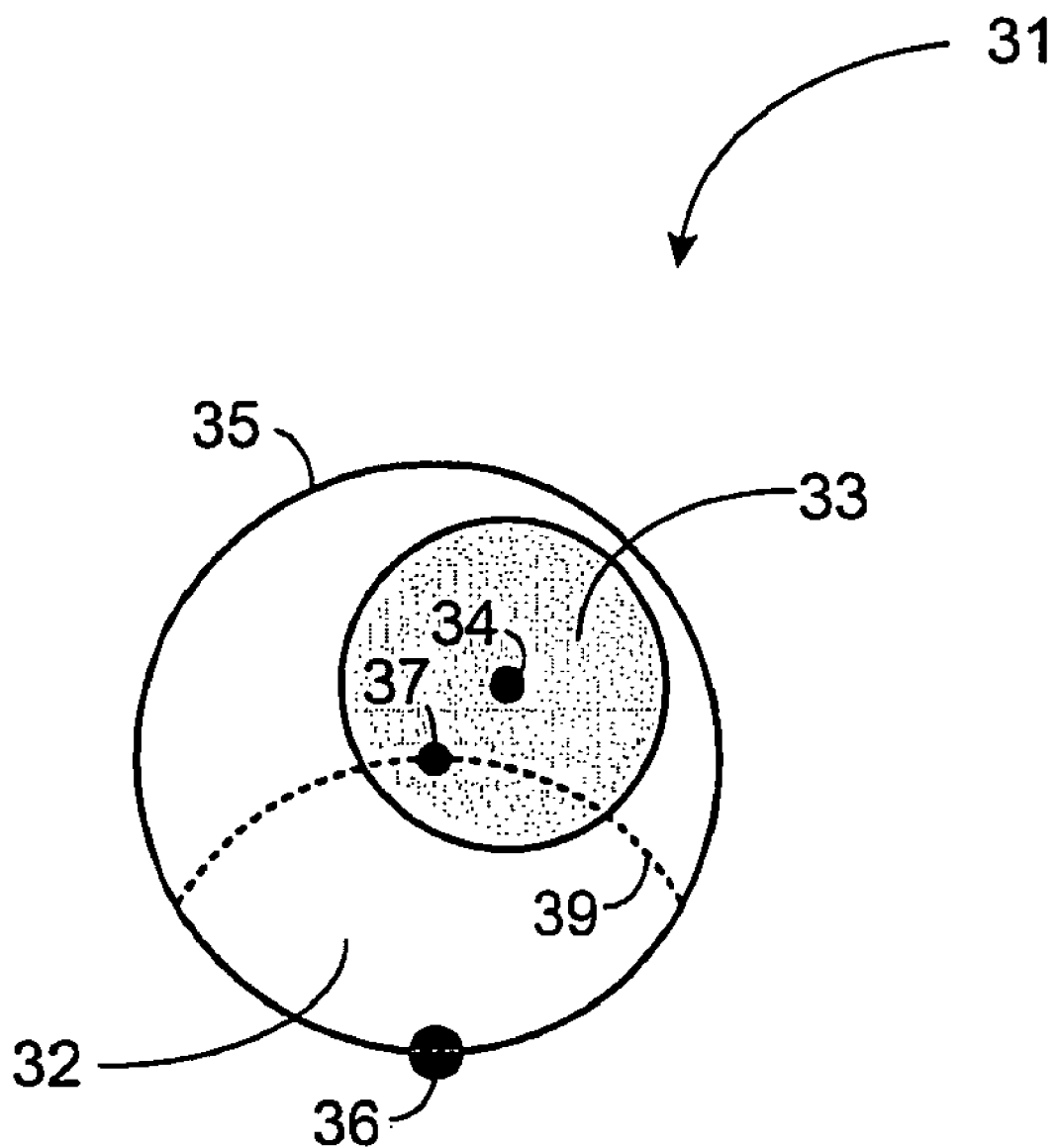
FIGS. 4-7 shows a top view of an exemplary printed circuit boards comprising a pad suitable to be soldered to a respective solder-ball of a device and having a microvia located therein according to some alternative embodiments of the invention.

FIG. 4 shows an exemplary PCB 31 comprising a pad 32 suitable to be soldered to a respective solder-ball of a device. Pad 32, which for the clarity of the explanation is substantially round, comprises a microvia 33 according to some embodiments of the invention. A point 36 is the anticipated location of the crack initiation point on perimeter 35 of pad 32. The center 34 of microvia 33 is farther than the center 37 of pad 32 from point 36. For the clarity of the drawing, a dashed curve 39 is shown, which is an equidistance curve from point 36 containing the center 37 of pad 32.

An instruction according to some embodiments of the invention, used in the implementation of pad 32 and microvia 33 is to locate microvia 33 inside pad 32 such that the center of microvia 33 is farther than the center of pad 32 from point 36.

Figure 5:
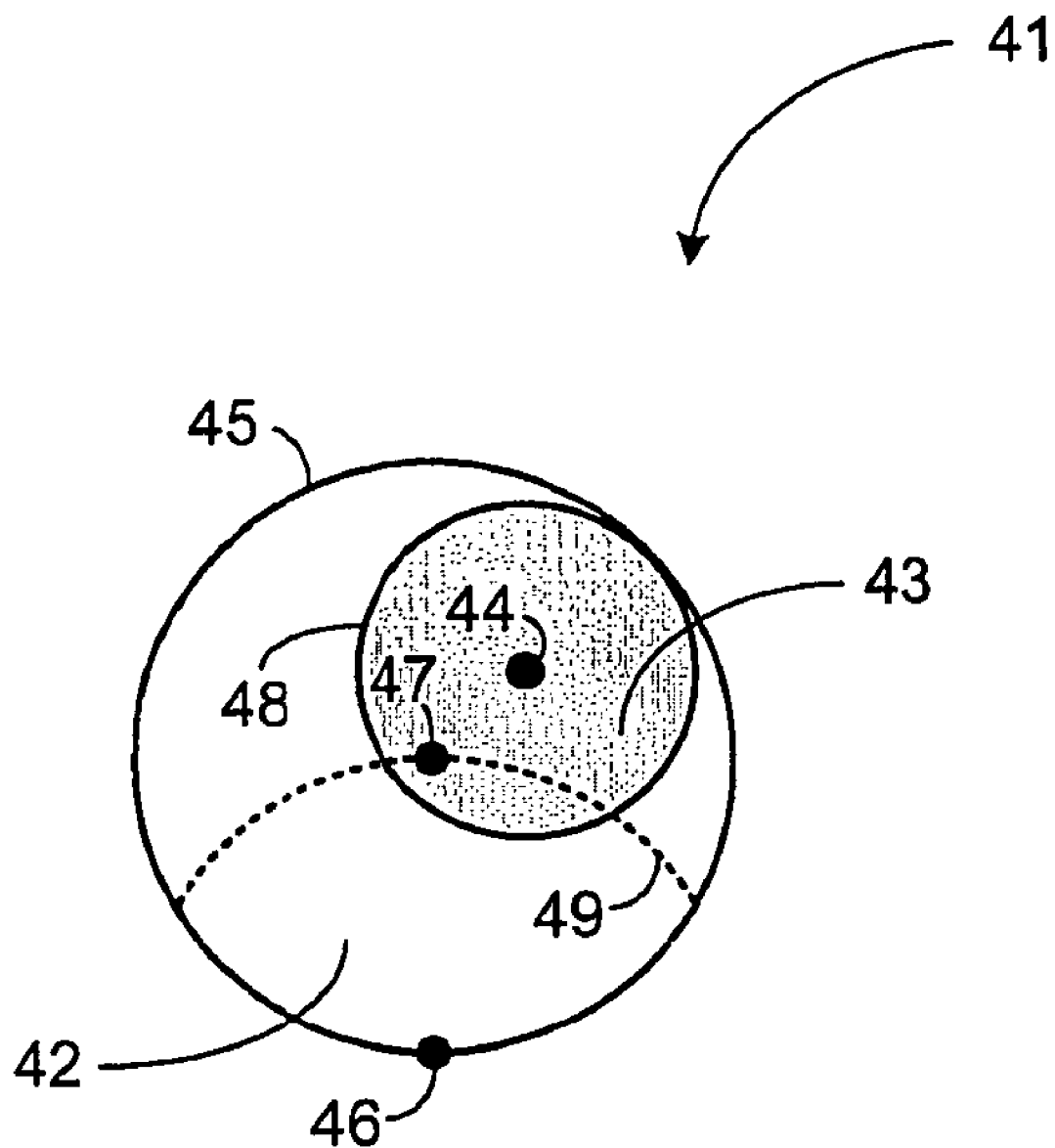

FIG. 5 shows an exemplary PCB 41 comprising a pad 42 suitable to be soldered to a respective solder-ball of a device. Pad 42, which for the clarity of the explanation is substantially round, comprises a microvia 43 according to some embodiments of the invention. A point 46 is the anticipated location of the crack initiation point on a perimeter 45 of pad 42. The center 44 of microvia 43 is farther than the center 47 of pad 42 from point 46. In addition, at least one point of perimeter 48 of microvia 43 is located on perimeter 45 of pad 42. For the clarity of the drawing, a dashed curve 49 is shown, which is an equidistance curve from point 46 containing the center 47 of pad 42.

A first instruction according to some embodiments of the invention, used in the implementation of pad 42 and microvia 43 is to locate microvia 43 inside pad 42 such that the center of microvia 43 is farther than the center of pad 42 from point 46.

A second instruction according to the invention, used in the implementation of pad 42 and microvia 43 is to locate microvia 43 inside pad 42 such that at least one point of perimeter 48 of microvia 43 is located on perimeter 45 of pad 42.

Figure 6:
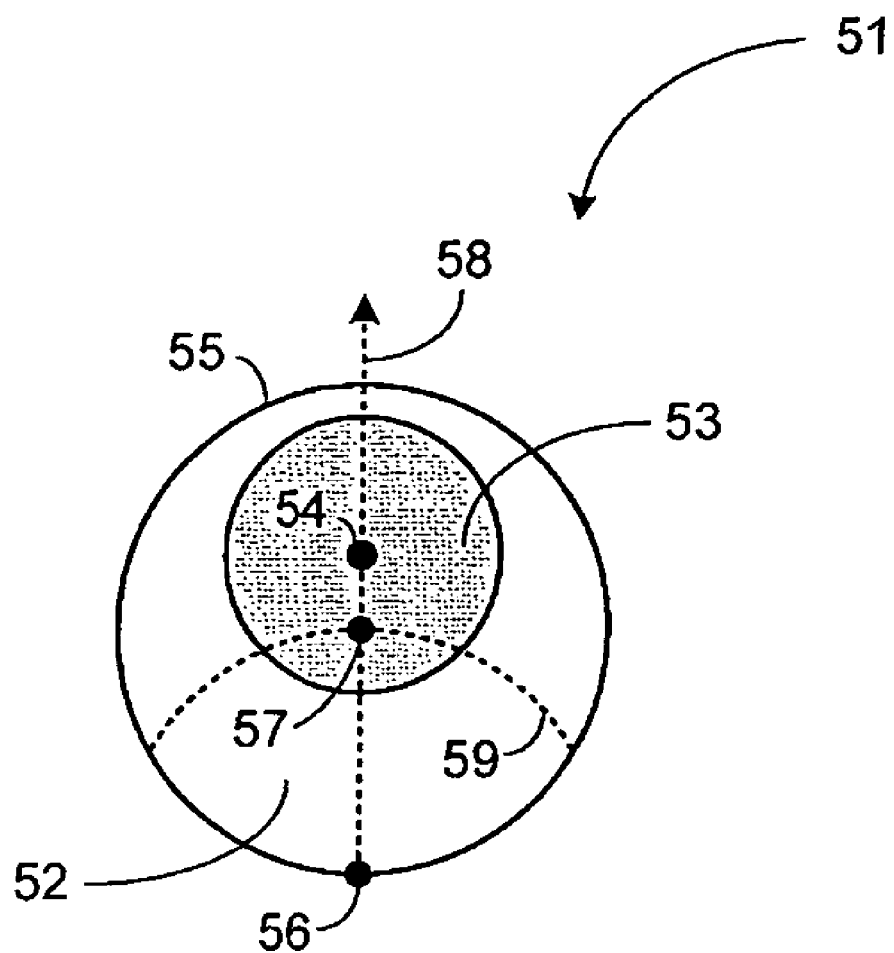

FIG. 6 shows an exemplary PCB 51 comprising a pad 52 suitable to be soldered to a respective solder-ball of a device.

Pad 52, which for the clarity of the explanation is substantially round, comprises a microvia 53 according to some embodiments of the invention. A point 56 is the anticipated location of the crack initiation point on a perimeter 55 of pad 52. A vector 58 beginning at point 56 is the projection onto pad 52 of the anticipated crack propagation direction. The center 54 of microvia 53 is located on vector 58 and is farther than the center 57 of pad 52 from point 56. For the clarity of the drawing, a dashed curve 59 is shown, which is an equidistance curve from point 56 containing the center 57 of pad 52.

A first instruction according to some embodiments of the invention, used in the implementation of pad 52 and microvia 53 is to locate microvia 53 inside pad 52 such that the center of microvia 53 is farther than the center of pad 52 from point 56.

A second instruction according to some embodiments of the invention, used in the implementation of pad 52 and microvia 53 is to locate center 54 of microvia 53 on vector 58.

Figure 7:
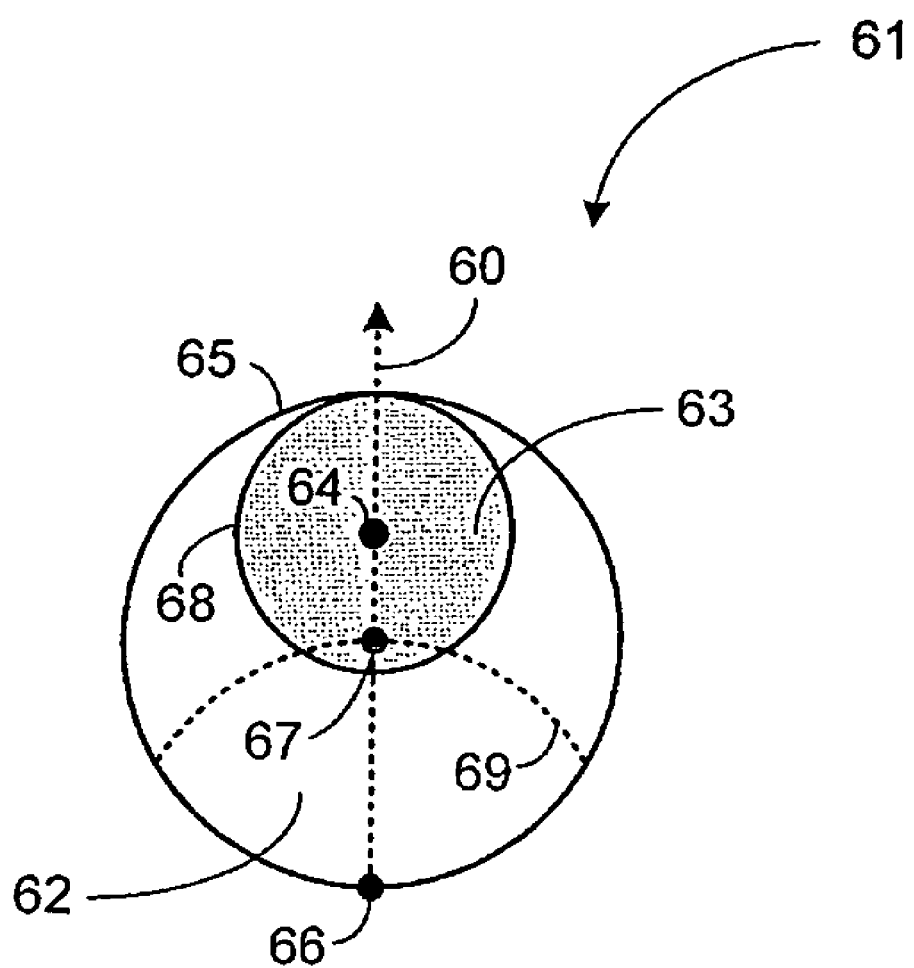

FIG. 7 shows an exemplary PCB 61 comprising a pad 62 suitable to be soldered to a respective solder-ball of a device. Pad 62, which for the clarity of the explanation is substantially round, comprises a microvia 63 according to some embodiments of the invention. A point 66 is the anticipated location of the crack initiation point on a perimeter 65 of pad 62. A vector 60 initiated at point 66 is the projection onto pad 62 of the anticipated crack propagation direction. The center 64 of microvia 63 is located on vector 60 and is farther than the center 67 of pad 62 from point 66. In addition, at least one point of perimeter 68 of microvia 63 is located on perimeter 65 of pad 62. For the clarity of the drawing, a dashed curve 69 is shown, which is an equidistance curve from point 66 containing the center 67 of pad 62.

A first instruction according to some embodiments of the invention, used in the implementation of pad 62 and microvia 63 is to locate microvia 63 inside pad 62 such that the center of microvia 63 is farther than the center of pad 62 from point 66.

A second instruction according to some embodiments of the invention, used in the implementation of pad 62 and microvia 63 is to locate center 64 of microvia 63 on vector 60.

A third instruction according to some embodiments of the invention, used in the implementation of pad 62 and microvia 63 is to locate microvia 63 inside pad 62 such that at least one point of perimeter 68 of microvia 63 is located on perimeter 65 of pad 62.

Figure 8:
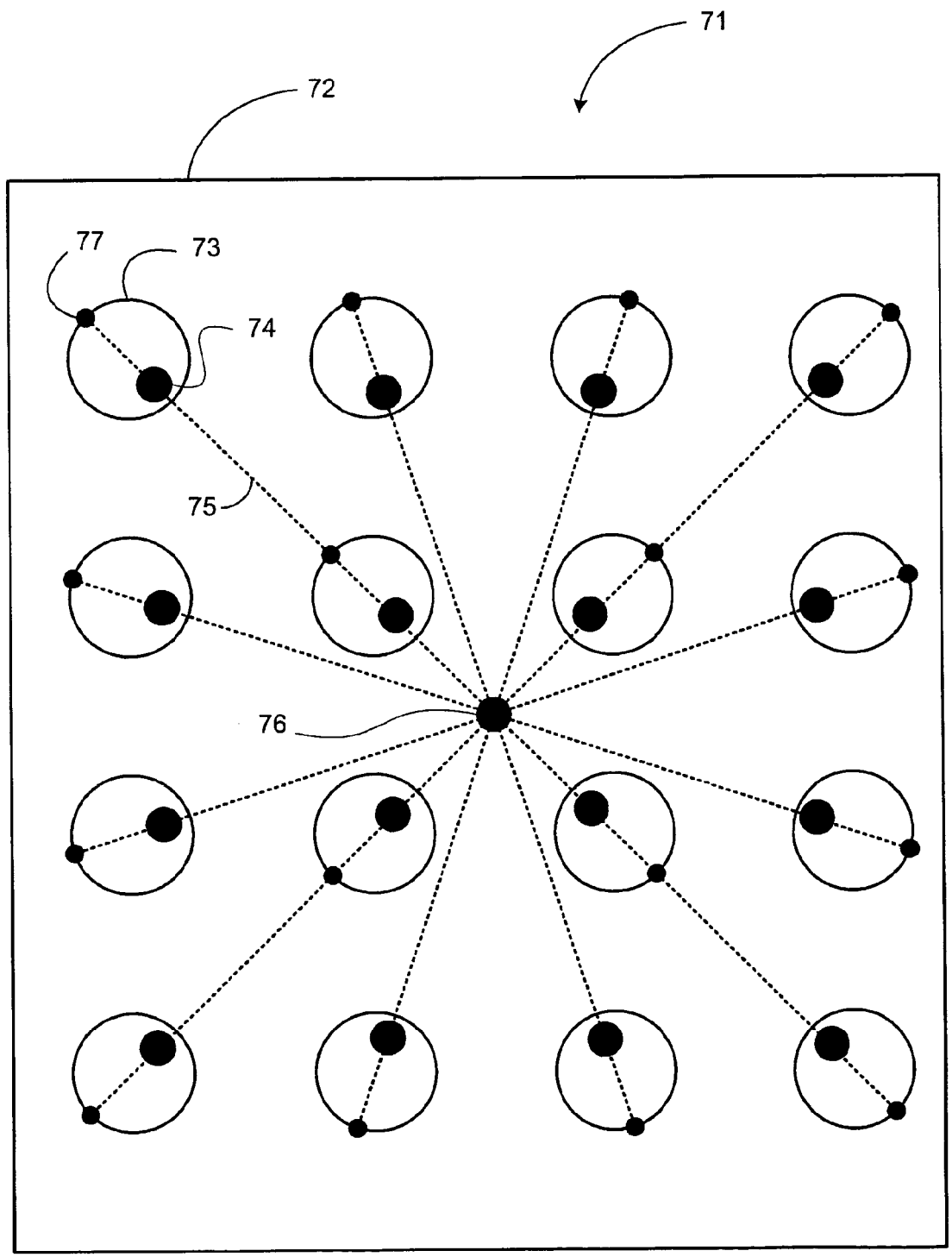
FIG. 8 shows a top view of an exemplary printed circuit boards comprising pad suitable to be soldered to a respective solder-balls of a device and having microvias located therein according to some embodiments of the invention.

FIG. 8 shows an exemplary PCB 71 comprising a "footprint" 72. Footprint 72 may be suitable to have installed thereon a device having a ball grid array (BGA) package of sixteen solder balls arranged in an array of four columns and four rows. Footprint 72 may therefore comprise sixteen pads 73 suitable to be soldered to respective ones of the sixteen solder-balls of the device. Pads 73 have microvias 74 located therein.

Moreover, and although the scope of the invention is not limited in this respect, a projection 75 onto PCB 71 of the anticipated crack propagation directions in solder balls of a device soldered to pads 73 may point toward a common point 76, and an anticipated crack initiation point 77 of each solder ball may be located near the point of the pad that is the farthest from common point 76. Microvias 74 are located such that the center of microvias 74 are farther than the center of the respective pad 73 from common point 76.

Figure 9:
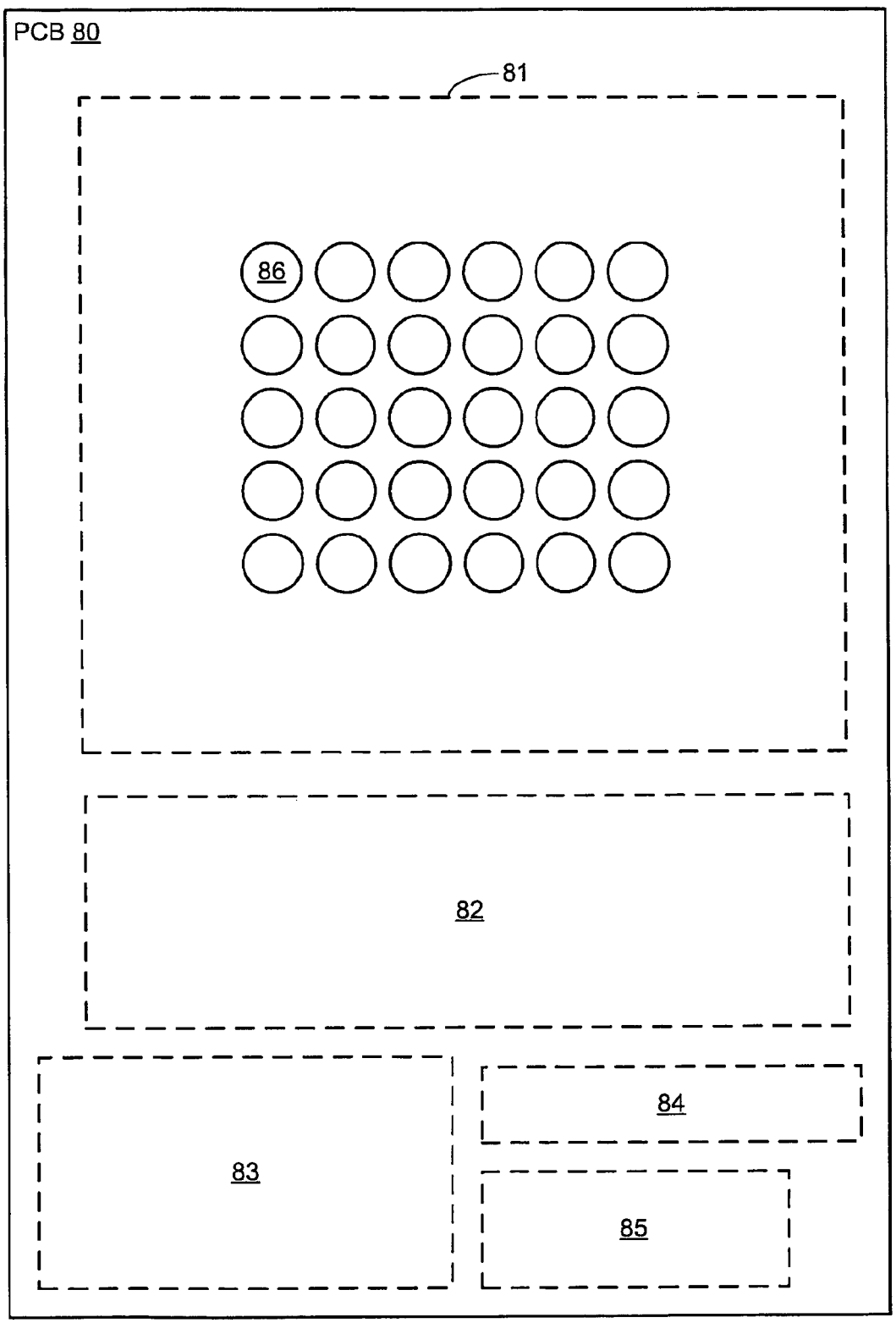
FIG. 9 is a top view of an exemplary printed circuit board in accordance with some embodiments of the invention.

FIG. 9 shows an exemplary PCB 80 in accordance with some embodiments of the invention. PCB 80 may comprise, for example, "footprints" 81, 82, 83, 84, and 85 for respective devices. Mechanical features and additional footprints of PCB 80 are not shown for clarity. Footprint 81 may be suitable to have installed thereon a device having a ball grid array (BGA) package of thirty solder balls arranged in an array of six columns and five rows. Footprint 82 may therefore comprise thirty pads 86 suitable to be soldered to respective ones of the thirty solder-balls of the device.

PCB 80 may comprise traces (not shown) merging with some or all of pads 86 according to embodiments of the present invention. In addition, PCB 80 may comprise microvias located in some or all of pads 86 according to embodiments of the invention.

Figure 10:
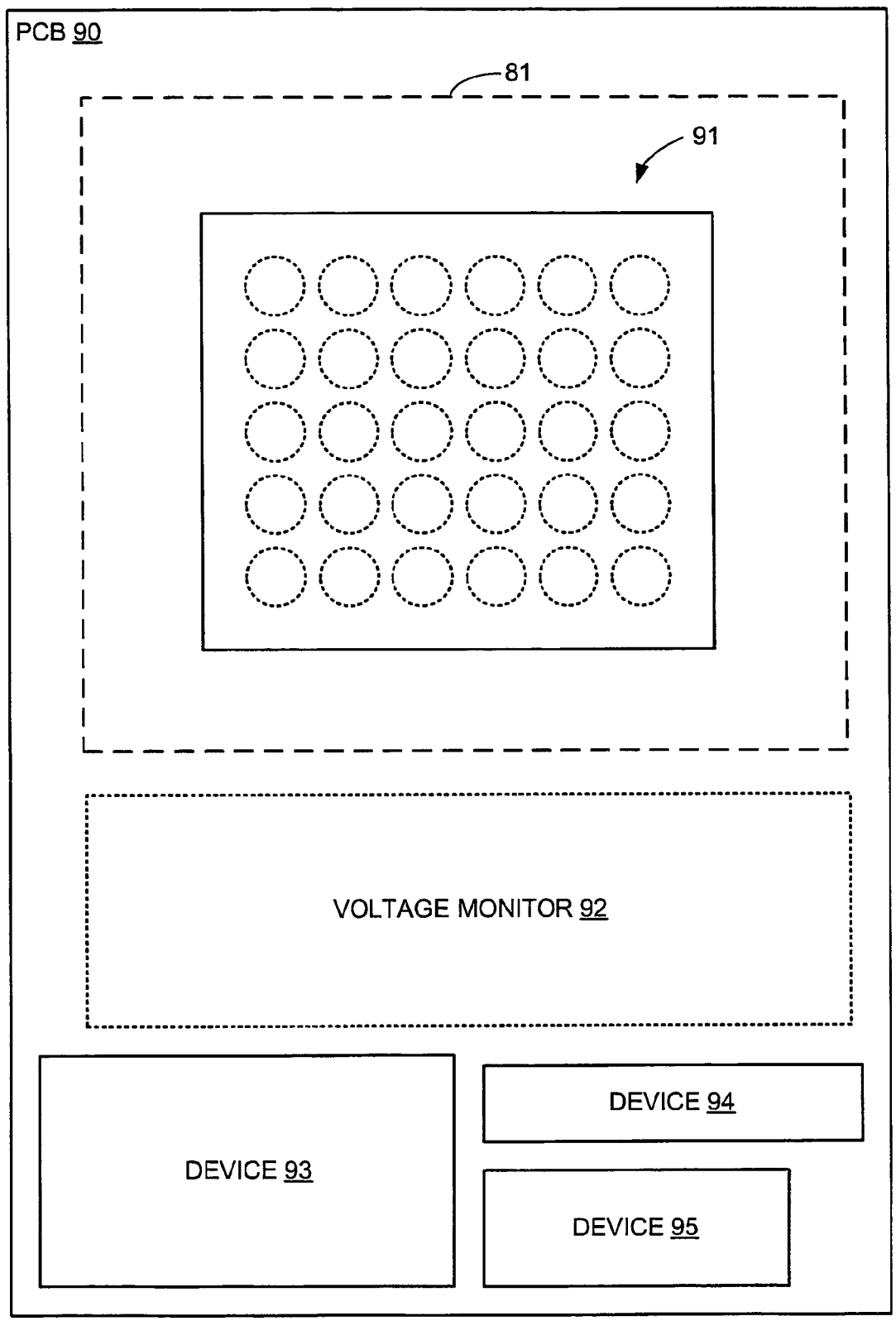
FIG. 10 is a top view of an exemplary printed circuit board having devices installed thereon, in accordance with some embodiments of the invention.

FIG. 10 shows an exemplary PCB 90 in accordance with some embodiments of the invention. PCB 90 may have installed thereon some devices, for example, devices 93, 94, and 95, and may optionally have installed thereon a voltage monitor 92. PCB 90 may have installed on footprint 81 a device 91 having a BGA package of thirty solder balls arranged in an array of six columns and five rows. Mechanical features and additional footprints of PCB and additional devices installed on PCB 90 are not shown for clarity. As a non-limiting example, PCB 90 may be a motherboard.

Figure 11:
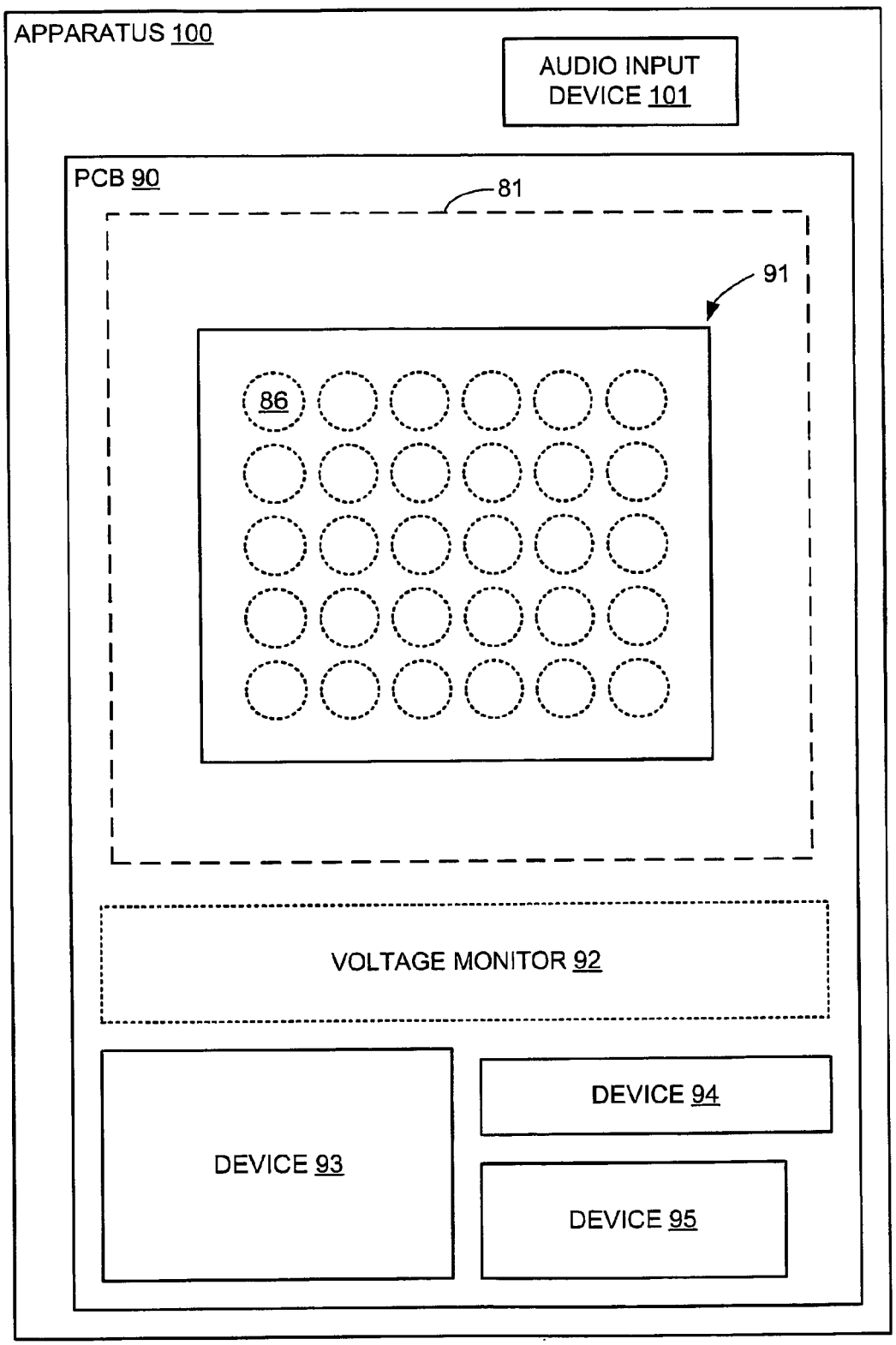
FIG. 11 is a top view of an exemplary apparatus including an exemplary printed circuit board, the exemplary printed circuit board having devices installed thereon, in accordance with some embodiments of the invention.

FIG. 11 shows an exemplary apparatus 100 in accordance to some embodiments of the invention. Apparatus 100 may comprise PCB 90 of FIG. 10, and may optionally comprise an audio input device 101. A non-exhaustive list of examples for apparatus 100 includes a personal computer (PC), a notepad computer, a notebook computer, a laptop computer, a server computer, a pocket PC, a personal digital assistant (PDA), a personal information manager (PIM), a cellphone, a pager, a mobile or non-mobile memory storage device, a hard disk drive (HDD), a floppy disk drive (FDD), a monitor, a projector, a digital video disc (DVD) player, a video compact disc (VCD) player, an MP3 player, a mobile media player, a calculator, a wireless local area network (LAN) access point, a LAN router, and the like.

As a result of using instructions according to embodiments of the invention during the implementation of a PCB, solder balls of a device that are soldered to pads of PCB implemented using these instructions may be more immune to crack initiation, and cracks may propagate more slowly and/or may cause damage to the solder balls more slowly than if that PCB was implemented without these instructions. It will be appreciated that the instructions need not be satisfied for all the pads and all the traces to which the guidelines apply for the solder balls to be more immune to crack initiation and for cracks to propagate more slowly and/or to cause damage to the solder balls more slowly.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A printed circuit board comprising:
   pads suitable to be soldered to respective solder-balls of a device, said pads having microvias located therein, where a center of a microvia of a pad is farther than a center of said pad from a crack initiation point located on a perimeter of said pad at a location where cracks in a solder-ball are anticipated to start after said solder-ball is soldered to said pad.

2. The printed circuit board of claim 1, wherein at least one of said pads is a metal-defined pad.

3. The printed circuit board of claim 1, wherein at least one of said pads is a solder-mask-defined pad.

4. The printed circuit board of claim 1, wherein at least one of said pads is substantially round.

5. The printed circuit board of claim 4, wherein a straight line joining said crack initiation point and said center of said microvia is parallel to the projection onto the pad of the crack propagation direction for said solder-ball.

6. The printed circuit board of claim 5, wherein at least one point of the perimeter of said microvia is located on the perimeter of said pad.

7. The printed circuit board of claim 1, wherein at least one point of the perimeter of said microvia is located on the perimeter of said pad.

8. A printed circuit board having a device installed thereon, the printed circuit board comprising:

pads soldered to respective solder-balls of said device, said pads having microvias located therein, where a center of a microvia of a pad is farther than a center of said pad from a crack initiation point located on a perimeter of said pad at a location where cracks in a solder-ball are anticipated to start after said solder-ball is soldered to said pad, wherein said printed circuit board has a voltage monitor installed thereon.

9. The printed circuit board of claim 8, wherein at least one of said pads is a metal-defined pad.

10. The printed circuit board of claim 8, wherein said printed circuit board is a motherboard.

* * * * *